United States Patent [19]
Johnson

[11] Patent Number: 4,576,135
[45] Date of Patent: Mar. 18, 1986

[54] FUEL INJECTION APPARATUS EMPLOYING ELECTRIC POWER CONVERTER

[75] Inventor: Ronald M. Johnson, Rochester, Mich.

[73] Assignee: TRW Inc., Cleveland, Ohio

[21] Appl. No.: 603,492

[22] Filed: Apr. 24, 1984

[51] Int. Cl.$^4$ .............................................. F02D 41/20
[52] U.S. Cl. .................................... 123/490; 123/478; 363/15
[58] Field of Search .................. 123/490, 478; 363/15

[56] References Cited

U.S. PATENT DOCUMENTS

| | | | |
|---|---|---|---|
| 3,613,644 | 10/1971 | Porsche et al. | 123/490 |
| 3,786,314 | 1/1974 | Misch | 317/154 |
| 3,786,344 | 1/1974 | Davis et al. | 123/490 |
| 3,870,943 | 3/1975 | Weischedel et al. | 321/2 |
| 4,041,546 | 8/1977 | Stewart | 361/152 |
| 4,148,090 | 4/1979 | Kawai et al. | 361/152 |
| 4,162,524 | 7/1979 | Jansson | 363/56 |
| 4,190,022 | 2/1980 | Long | 123/490 |
| 4,257,089 | 3/1981 | Ravis | 363/25 |
| 4,266,261 | 5/1981 | Streit et al. | 361/154 |
| 4,327,394 | 4/1982 | Harper | 361/154 |
| 4,338,651 | 7/1982 | Henrich | 361/154 |
| 4,355,619 | 10/1982 | Wilkinson | 123/490 |
| 4,373,697 | 2/1983 | Phelps | 251/129 |
| 4,417,201 | 11/1983 | Reddy | 123/490 |
| 4,479,161 | 10/1984 | Henrich et al. | 123/490 |

OTHER PUBLICATIONS

Data Sheet for TL 494 Integrated Circuit.
Data Sheet for L5832 Integrated Circuit.

Primary Examiner—Andrew M. Dolinar
Attorney, Agent, or Firm—Yount & Tarolli

[57] ABSTRACT

Fuel injection apparatus including a power converter for generating a stable, high voltage DC signal for powering the fuel injectors. The power converter is connected to a voltage source such as a vehicle battery. The power converter includes a DC-DC converter and a feedback-stabilized converter control circuit. The converter control circuit adjusts the operation of the DC-DC converter in a direction to counteract changes in output voltage caused by battery voltage variations. The high voltage DC signal is applied to each injector through one or more solid state switches. Since the signal used to power the fuel injectors is substantially constant regardless of normal battery voltage variations, the injector pull-in time is substantially constant. Moreover, the use of a high voltage power signal enables low current injectors to be used. The low injector current results in low power dissipation by the solid state switches which operate the injectors. The output voltage generated by the converter is also used to bootstrap the power signal applied to the converter control circuit.

9 Claims, 5 Drawing Figures

FUEL INJECTION APPARATUS EMPLOYING ELECTRIC POWER CONVERTER

BACKGROUND AND FIELD OF THE INVENTION

The present invention relates to fuel injection apparatus for internal combustion engines, and more specifically to electromechanical fuel injector systems and associated electronic controls.

Internal combustion engines traditionally employ one of several methods for introducing fuel into the combustion chambers of the engine. In one method, a carburator is connected to the air intake of the internal combustion engine. As air is sucked through the intake and thus through the carburator, fuel is sucked from a curburator fuel bowl and becomes entrained in the air. The fuel/air mixture is then guided into the various combustion chambers of the engine by an intake manifold.

In a second method, gaining greater popularity today because of its greater precision, high pressure fluid injector nozzles are used to inject fuel either directly into the combustion chambers of the engine or into associated mixing chambers. In many such fuel injection systems, the fuel injectors are entirely mechanical. Increasingly, however, electromechanical systems are instead being used.

Electromechanical fuel injection systems employ solenoid operated fuel injectors for each providing a precisely metered pulse of fuel to a corresponding combustion chamber or mixing chamber at the appropriate time during the cycle of the internal combustion engine. Often, sophisticated electronic control systems are used for controlling the timing, wave shape, and duration of the electrical pulse signals which actuate the solenoids of the fuel injectors. The control systems may be responsive to the temperature of the engine, the throttle position, and other variables as well.

Electronic control systems used in electromechanical fuel injection systems require a reliable and stable source of electric power. In vehicles, the source of electric power comprises of a chemical battery, usually providing a nominal 12 volt DC signal. The battery voltage can vary substantially during normal operation of the vehicle, however. When the engine is operating at normal cruise speeds, the battery voltage may be as high as 18 volts or more due to continuous charging of the battery by the alternator associated with the engine. The battery voltage will normally remain above 8 or 9 volts, but may drop as low as 5 volts or less during cold cranking of the engine.

In the past, the problem of battery voltage variation has been handled by designing the fuel injector solenoids so that they will actuate even under worst-case supply voltage conditions (i.e. during cold cranking of the engine). Designs of this nature do not provide a completely satisfactory solution to the problem because the time necessary for a solenoid to "pull-in" will still be dependent upon battery voltage. When power is applied to a solenoid coil, current flow through the coil will build up gradually due to coil inductance. The solenoid will not actuate, however, until the solenoid current reaches a certain threshold level. The amount of time necessary for the coil current to build up to the pull-in threshold is dependent upon the battery voltage. Thus, it takes longer for a solenoid to turn on when battery voltage is low than it does when battery voltage is high.

Furthermore, the solid state switches used to turn the solenoids on and off dissipate power as a function of the square of the current passing through the switch. Solenoids designed to operate directly from battery voltage tend to require substantial current for normal operation. The switches thus dissipate quite a lot of power.

SUMMARY OF THE INVENTION

The fuel injection system described herein employs an electric power converter to overcome the problems of the prior art. The power converter is powered by the battery, but generates an output voltage (described as being 60 volts) which does not vary significantly upon normal variations in the battery voltage. The output of the converter is used to power the solenoids. The time necessary for the solenoids to actuate thus remains constant despite battery voltage fluctuations. The solenoids, moreover, can be designed to draw less current since they are powered from a higher supply voltage. The solid state switches associated with the solenoids thus dissipate less power. The high voltage signal provided by the power converter is also used to bootstrap the power supply for the control circuits, thereby providing them with an adequate operating voltage even under low battery conditions.

Thus, in accordance with the present invention, apparatus is provided for use in conjunction with a fuel injection system of an internal combustion engine including electrically operated fuel injectors and a battery. The apparatus comprises means for converting the DC voltage provided by the battery into an oscillating voltage signal. The converting means is responsive to a feedback signal for controlling at least one characteristic of the oscillating voltage signal. Transformer means is included which is responsive to the oscillating voltage signal for generating a second oscillating voltage signal of higher amplitude therefrom. Rectifier means is included for converting the second oscillating voltage signal into a second DC voltage signal. Another means provides the feedback signal in accordance with the second DC voltage signal and applies the feedback signal to the converting means. The feedback signal is such as to cause the converting means to adjust the characteristic of the oscillating voltage signal in a direction to counteract the changes in the DC voltage. Finally, means is provided for utilizing the second DC signal to power the electrically operated fuel injectors.

BRIEF DESCRIPTION OF THE DRAWINGS

The foregoing and other objects and advantages of the present invention will become more readily apparent from the following detailed description, as taken in conjunction with the accompanying drawings, wherein.

DETAILED DESCRIPTION

Figure 1:
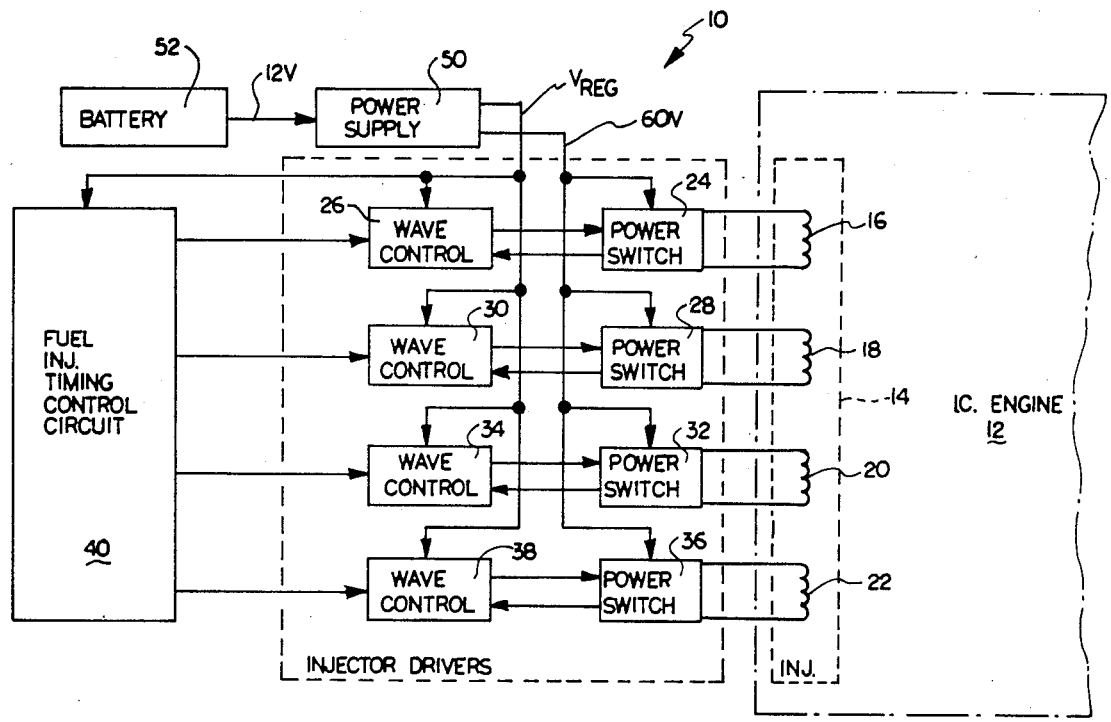
FIG. 1 is a block diagram of the control circuitry associated with an electromechanical fuel injection system for an internal combustion engine.

FIG. 1 is a block diagram of a fuel injection control system 10 for use in conjunction with an internal combustion (I.C.) engine 12. In FIG. 1, the internal combustion engine 12 is a four cylinder piston engine including a set of four fuel injectors 14. Each of the four fuel injectors includes a corresponding electromagnetic solenoid coil 16, 18, 20 and 22 for operating the fuel injector. Coils 16, 18, 20 and 22 are designed and constructed in a conventional manner. The coils will, however, have a greater number of coil turns than ordinary 12 volt injector coils since a higher supply voltage (described hereinafter) is used to power them. The coils will therefore draw less current than ordinary 12 volt injector coils.

The four electromagnetic coils are connected to the injection control circuit 10. Electromagnetic coil 16, for example, is connected to a power switch 24 which selectively applies power to the coil 16 under control of a waveform control circuit 26. When the power switch 24 is "on", power is applied across the coil 16, the injector solenoid actuates, and fuel is thus injected into the corresponding cylinder of the internal combustion engine 12. Fuel injection ceases when the power switch 24 turns "off".

The waveform control circuit 26 controls the state of the power switch 24 in response to a fuel injection timing pulse provided by a fuel injection timing control circuit 40. The timing control circuit 40 adjusts the time of occurrence and the duration of the timing pulse in accordance with the desired time of occurance and duration of fuel injection into the corresponding cylinder of the internal combustion engine. The waveform control circuit 26 modulates the current through the injection coil 16 during each injection timing pulse, providing high current to the coil initially and a much lower current after the injector solenoid has pulled in.

Each of the remaining coils, 18, 20 and 22, is connected to a corresponding power switch 28, 32, 36, and waveform control circuits 30, 34, 38. Each of the four waveform control circuits is controlled by a corresponding output of the fuel injection timing control circuit 40.

The injection drivers and fuel injection timing control circuit are electrically powered by power signals provided by a power supply 50. The power supply 50, in turn, is powered by a battery 52 associated with the vehicle (not shown) within which the internal combustion engine 12 is located. The power supply 50 generates a 60 volt DC signal for use by the power switches 24, 28, 32 and 36, and a lower, but regulated voltage $V_{REG}$ for powering the waveform control circuits 26, 30, 34, 38, and the fuel injection timing control circuit 40.

Figure 2:
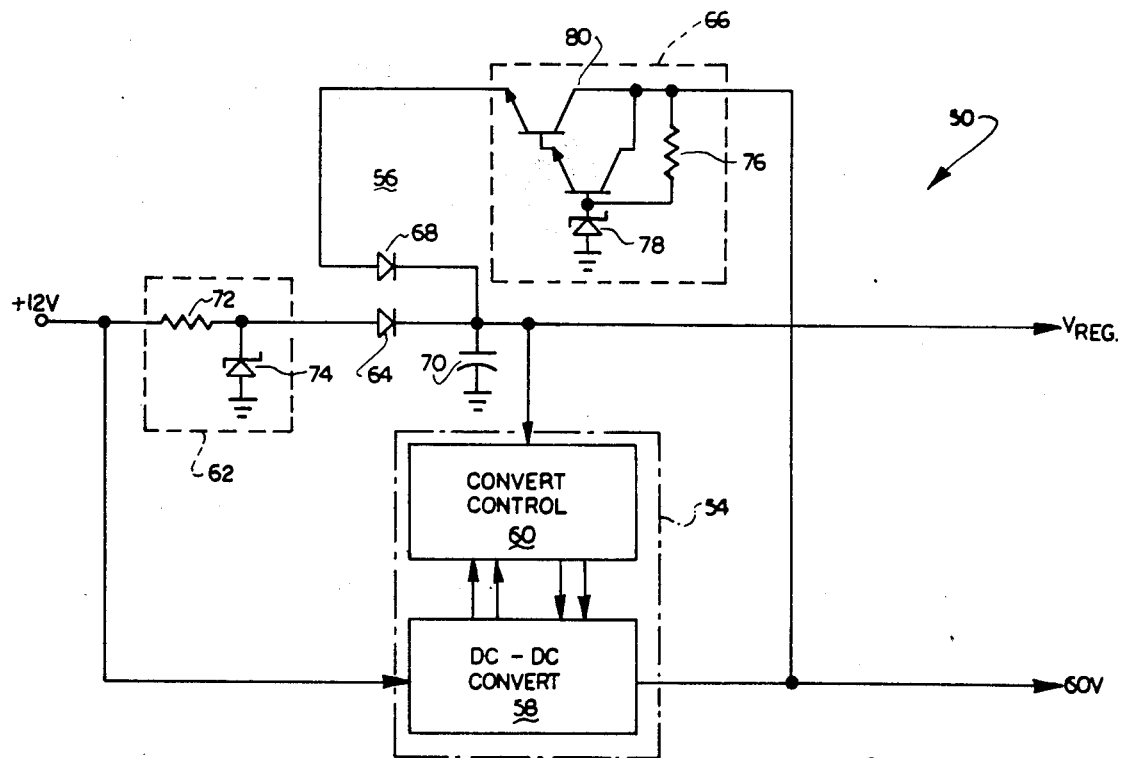
FIG. 2 is a block diagram of the power supply used with the system of FIG. 1.

As shown in FIG. 2, the power supply circuit 50 includes a first circuit 54 for generating the 60 volt DC signal used by the power switches and fuel injector coils, and a second circuit 56 for generating the lower, regulated DC voltage for powering the control circuit associated with the injection control system. The first circuit 54 comprises an electric power converter including a DC-DC converter 58 and a converter control circuit 60.

The DC-DC converter 58 converts the nominal 12 volt DC signal into a nominal 12 volt AC signal, applies the AC signal to a transformer which increases it to a nominal 60 volt AC signal, and then rectifies the 60 volt AC signal to derive the desired 60 volt DC signal. The converter control circuit 60 controls the operation of the DC-DC converter 58 so as to both regulate the output voltage and protect the DC-DC converter from drawing excessive current. The 60 volt DC signal provided by the electric power converter 54 remains essentially constant despite normal variations in the battery voltage.

The second circuit 56 of the power supply 50 generates a regulated DC signal for powering the control electronics by bootstrapping the normal battery voltage with a signal derived from the 60 volt DC output of the first circuit 54. As shown in FIG. 2, the nominal 12 volt DC signal provided by the battery is applied to the $V_{REG}$ line through a conventional zener diode voltage regulator 62 and a diode 64. The 60 volt DC signal provided by the electric power converter 54, on the other hand, is applied to the $V_{REG}$ line through a series-pass voltage regulator 66, and a diode 68. A power supply filter capacitor 70 is connected between the $V_{REG}$ line and ground to filter the power signal.

The zener diode regulator 62 is included principally to protect the electronic circuitry from excessively high battery voltages. Regulator 62 includes a series resistor 72 and a shunt zener diode 74. Since the zener voltage of diode 74 is relatively high (e.g., 18 volts), the battery voltage will normally be less than the zener voltage and the zener will therefore be nonconductive. The voltage at the output of the regulator 62 will thus normally be approximately equal to the battery voltage. If the battery voltage rises above the zener voltage of the zener diode 74, however, zener diode 74 will become conductive, preventing $V_{REG}$ from exceeding the zener voltage.

The series-pass regulator 66 connected to the 60 volt DC line also includes a zener diode regulator, in this case including a series resistor 76 and a zener diode 78. The series-pass regulator also, however, includes a Darlington-pair transistor amplifier 80. The transistor amplifier 80 buffers the voltage appearing across the zener diode 78, enabling the regulator to operate without needless dissipation of excess power. The zener diode 78 used in the series-pass regulator 66 has a zener voltage of approximately 10 volts. The voltage at the output of the second regulator 66 will only be about 8.5 to 9.0 volts, however, due to the voltage drop of between 1.0 and 1.5 volts added by the base-emitter junctions of the two transistors of the Darlington-pair transistor amplifier 80.

As long as the power signal provided by the battery 12 is above 8.8 volts or so, diode 64 will be turned on and the voltage across the capacitor 70 will be controlled by regulator 62. In this event, the diode 68 will be reverse biased or only slightly forward biased, and therefore will be nonconductive. Thus, substantially the entirely operating current required of the $V_{REG}$ power line will come through the regulator 62. If the battery voltage drops below approximately 8.8 volts, however, diode 68 will become forward biased and diode 64 will become reverse biased. With diode 68 forward biased, power is supplied to the $V_{REG}$ line through the series-pass regulator 66. The series-pass regulator maintains the voltage on the $V_{REG}$ power line at approximately 8.3 volts regardless of the level to which the battery voltage drops, since the regulator receives its power from the stable output of the electric power converter 54.

Figure 3:
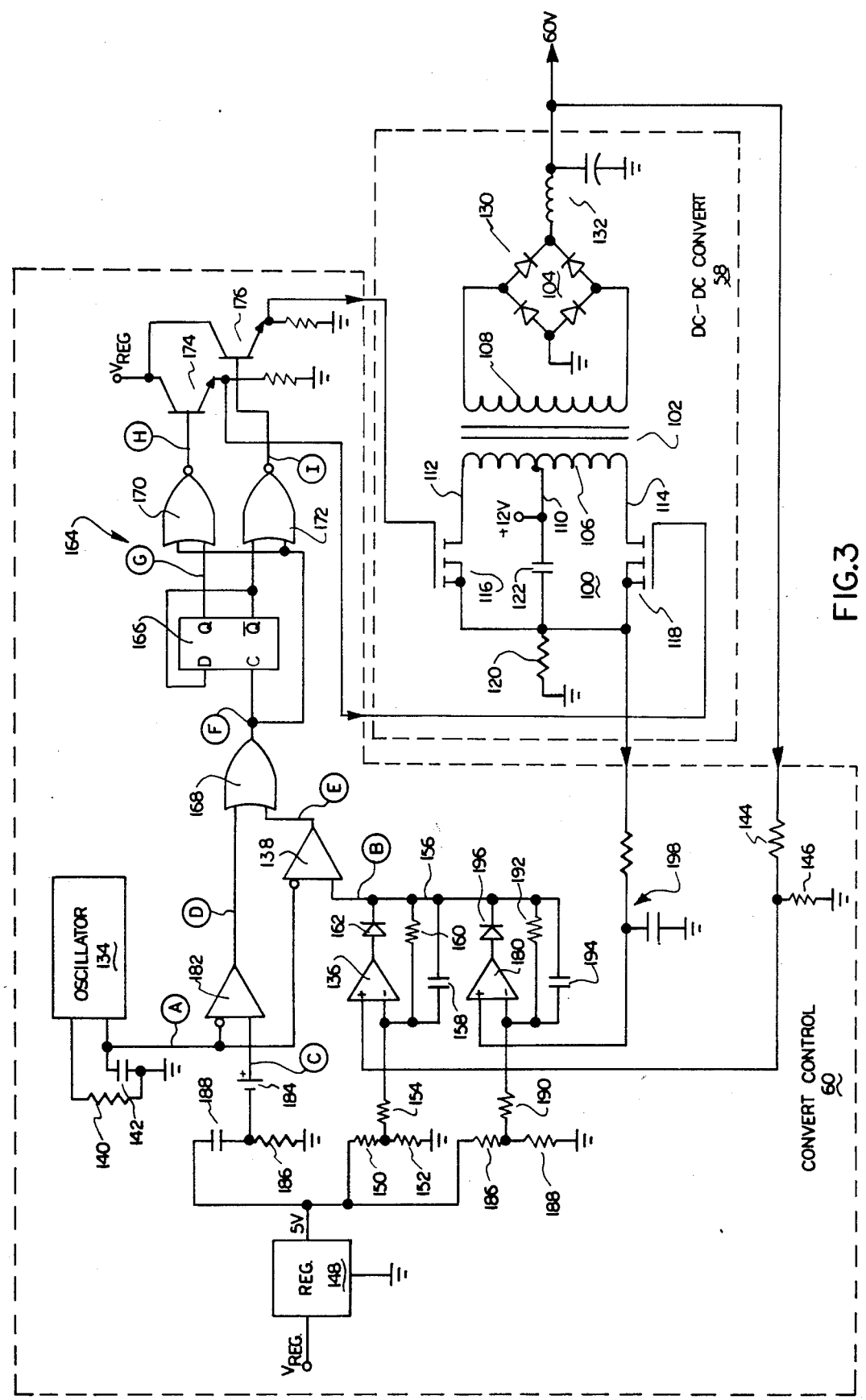
FIG. 3 is a circuit schematic of the converter control and DC-DC converter blocks of the FIG. 2 block diagram.

FIG. 3 is a more detailed circuit schematic of the elements within the electric power converter 54 (FIG. 2). The heart of the electric power converter is the DC-DC converter circuit 58. The DC-DC converter includes a circuit 100 for converting the nominal 12 volt battery voltage into an AC signal, a transformer 102 for transforming the AC signal into an AC signal of higher amplitude, and a rectifier circuit 104 for rectifying the resulting high voltage AC signal to produce the desired 60 volt DC output signal. The transformer 102 includes a primary winding 106 and a secondary winding 108. The primary winding 106 is center-tapped, and has its center conductor 110 connected to the nominal 12 volt battery voltage. Each of the two end leads 112 and 114 of the primary winding is connected to ground through a circuit including a respective MOSFET switching device 116 and 118. Specifically, the lead 112 of the transformer 102 is connected to the drain of a MOSFET 116, whereas the lead 114 of the transformer 102 is connected to the drain of a MOSFET 118. The source electrodes of the two MOSFETs 116 and 118 are connected to ground through a common current sensing resistor 120. A capacitor 122 is connected between the center conductor 110 of the primary transformer winding and the resistor 120 to smooth the current flow through the transformer.

Figure 4:
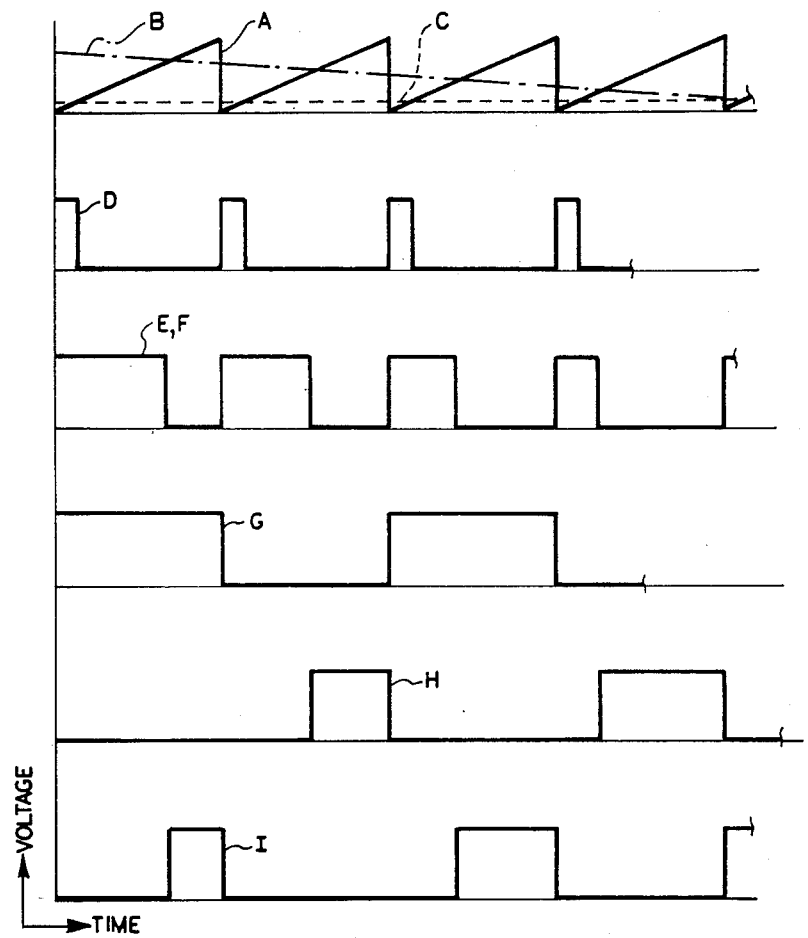
FIG. 4 is a series of waveforms taken from different points in the FIG. 3 circuitry.

The MOSFETs 116 and 118 associated with the DC-DC converter 58 are operated by electrical pulse signals provided by the converter control circuit 60. The converter control circuit 60 includes a pulse width modulator circuit which generates periodic pulses of varying duration (see waveforms E, F of FIG. 4). A steering circuit to be described hereinafter causes alternate pulses to be applied to different MOSFETs. (In FIG. 4, waveforms H and I represent the input signals to MOSFETs 118 and 116, respectively.) Thus, if one pulse causes MOSFET 116 to momentarily turn on, the next pulse will cause MOSFET 118 to momentarily turn on, the next, MOSFET 116, and so on. This alternation of operation of the two MOSFETs causes current to flow through the primary winding 106 first in one direction, and then in another, causing a symmetrical AC signal to be generated across the secondary winding 108 of the transformer 102. The ratio of the number of turns in the secondary winding 108 to the number of turns in the primary winding 106 is such that the voltage signal developed across the secondary winding 108 has much greater amplitude than 12 volts.

The AC voltage signal across the secondary winding is rectified and filtered by a circuit 104. The circuit 104 includes a conventional full wave rectifier 130 and a conventional LC low pass filter 132. The output of the low pass filter 132 is a DC signal whose magnitude is dependent upon the duration of the pulses applied to the two MOSFETs 116 and 118.

The converter control circuit 60 measures the voltage at the output of the DC-DC converter 58 and adjusts the duration of the pulses provided to the MOSFETs 116 and 118 so as to cause the DC output of the converter circuit 58 to remain at approximately 60 volts DC. An integrated circuit such as the type TL494 pulse width modulation control circuit can be used to provide the functions required of the convert control circuit 60 of FIG. 3. The TL494 is manufactured and sold by Texas Instruments Incorporated of Dallas, Tex.

As stated previously, the converter control circuit 60 includes a pulse width modulator circuit. The pulse width modulator circuit generally includes an oscillator 134 for generating a ramp signal (waveform A of FIG. 4), an error amplifier 136 for generating an error signal (waveform B of FIG. 4) representative of the error between the desired and actual values of the DC output of converter circuit 58, and a comparator circuit 138 for comparing the ramp signal provided by oscillator 134 against the error signal provided by error amplifier 136 to thereby produce the pulse width modulated signal (waveform E of FIG. 4) which is ultimately used to control the operation of the DC-DC converter circuit 58.

The oscillator 134 includes external resistor and capacitor components 140 and 142 which control the frequency of the ramp signal generated by the oscillator. Oscillator 134 generates the ramp signal by feeding a constant current into a capacitor 142, causing it to charge at a linear rate, and then discharging the capacitor 142 rapidly once the voltage signal across the capacitor reaches a preset level. The result of the charging and discharging operation is a ramp signal as shown at A in FIG. 4. The ramp signal has a constant frequency, determined by the values of the resistor and capacitor components 140 and 142.

Error amplifier 136 generates the error signal by effectively comparing the magnitude of the output signal provided by the converter circuit 58 with a reference signal representative of the desired level of the output signal. The output of the converter circuit 58 is "measured" by a resistive divider consisting of two resistors 144 and 146 connected in series between the output of converter circuit 58 and ground. The junction between the two resistors 144 and 146 is connected to the noninverting input of the error amplifier 136. The voltage at the noninverting input of error amplifier 136 is therefore proportional to the output signal provided by DC-DC converter 58, but is of substantially lower magnitude.

The inverting input of the error amplifier 136 is connected to a reference voltage source. The reference voltage is provided by a second resistive divider, connected between the output of a regulator circuit 148 and ground. The regulator circuit 148 is included to convert the $V_{REG}$ voltage into a very stable DC voltage of somewhat lower magnitude. In the example being described herein, the regulator 148 provides a highly stable five volt output signal. The resistive divider providing the reference signal to error amplifier 136 includes resistors 150 and 152 connected in series between the output of regulator 148 and ground. The reference voltage appearing at the junction between the two resistors 150 and 152 is provided to the inverting input of amplifier 136 through an input resistor 154.

Error amplifier 136 has an integrating feedback network connected between its output and inverting inputs such that the output signal provided by the error amplifier is substantially equal to the integral of the difference between the desired and actual values of the output of DC-DC converter 58. The integrating feedback network includes a capacitor 158 in parallel with a resistor 160. A diode 162 is connected between the output of error amplifier 136 and the integrating feedback network so that the error amplifier 136 can be connected in parallel with a second error amplifier 180 to be described hereinafter. The junction between the diode 162 and the integrating feedback network is coupled to an input 156 of the signal comparator 138.

Signal comparator 138 provides an output signal which has a high logic level (i.e., approximately $V_{REG}$)

whenever the error signal provided by error amplifier 136 is higher in magnitude than the ramp signal provided by oscillator 134, and a low logic level (e.g., approximately ground) otherwise. Since the ramp signal has a maximum magnitude which is designed to be greater than the maximum error signal, the ramp signal will rise above the error signal at some point during each cycle of the ramp signal. Thus, the output signal provided by the comparator 138 will periodically drop to a low logic level, with the duration of the high logic level portion of the signal being directly dependent upon the magnitude of the error signal provided by the error amplifier 136. If the error signal increases, then the duration of the pulses provided by error amplifier 138 will increase. If, on the other hand, the error signal diminishes in amplitude, the duration of the pulses provided by signal comparator 138 will similarly diminish. The output of comparator 138 is therefore a pulse width modulated signal.

The pulse width modulated signal appearing at the output of signal comparator 138 is supplied to a pulse steering network 164. The purpose of the steering network 164 is to direct alternate pulses of the pulse width modulated signal to alternate MOSFETs of the DC-DC converter 58. Signal steering network 164 includes a type "D" flip-flop 166 whose inverted $\bar{Q}$ output is connected back to the D input of the flip-flop. When connected in this fashion, the Q and $\bar{Q}$ outputs of the flip-flop 166 will alternate states with each successive rising edge of the signal applied to the clock input of the flip-flop. For example, the Q output will switch from a low to a high logic level, while the $\bar{Q}$ output switches from a high to a low logic level. The clock input of flip-flop 166 is connected to the output of signal comparator 138 through an OR gate 168. Thus, each time the pulse width modulated signal provided by comparator 138 shifts to a high logic level, the flip-flop 166 changes states. The normal Q output of flip-flop 166 is connected to one input of a two input NOR gate 170, whereas the inverted $\bar{Q}$ output of flip-flop 166 is similarly connected to one input of another two input NOR gate 172. The remaining inputs of the two NOR gates 170 and 172 are connected in common to the output of OR gate 168.

NOR gates 170 and 172 are alternately enabled by the output signals provided by flip-flop 166, hence a pulse will be transmitted to the output of one and only one of the NOR gates in each cycle of the pulse width modulated signal. The NOR gates 170 and 172 also introduce a signal inversion, thereby producing output pulses having widths which change in inverse relationship to the error voltage. If the error voltage increases, the width of the pulses provided at the outputs of the NOR gates 170 and 172 will diminish, a vice versa. An increase in the magnitude of the output voltage of the DC-DC converter 58 will therefore result in a compensating decrease in the duration of the pulses provided to the DC-DC converter 58. On the other hand, a decrease in the magnitude of the voltage provided at the output of the DC-DC converter 58 will result in a compensating increase in the duration of the drive pulses applied to the converter by the converter control circuit 60.

The output signal provided by NOR gate 170 is applied to the gate electrode of MOSFET 118 through a conventional emitter-follower amplifier circuit 174. Similarly, the output of NOR gate 172 is applied to the gate electrode of MOSFET 116 through an emitter-follower amplifier circuit 176.

Beyond the foregoing, the converter control circuit 60 further includes a second error amplifier 180, and a second pulse width modulator comparator 182. The circuits 180 and 182 provide useful additional functions.

The second error amplifier 180 and its associated circuitry are identical in general layout to error amplifier 136 and its associated circuitry. A reference voltage divider is provided consisting of resistors 186 and 188 connected in series across the output of regulator 148, and an input resistor 190 connects the divider to the inverting input of amplifier 180. Furthermore, an integrating feedback network is connected between the output and inverting input of error amplifier 180. The feedback network includes a resistor 192 and a capacitor 194. A diode 196 is connected in series between the output of the error amplifier 180 and the integrating feedback network. The second error amplifier 180 monitors the current in the primary circuit of the DC-DC converter 58, and reduces drive to the converter in the event that current draw becomes excessive. The amount of current drawn by the primary circuit of the converter 58 is measured by sensing the voltage drop across the current sensing resistor 120. To this end, the noninverting input of error amplifier 180 is connected to the current sensing resistor 120 through a low pass filter 198. Filter 198 smooths and filters the current-representative signal.

The output of each error amplifier 136 and 180 is connected to line 156 through a respective diode 162 and 196. The diodes 162 and 196 effectively isolate the outputs of the error amplifiers 136 and 180 from one another. Each diode is forward biased only when the error signal at the output of its error amplifier is greater than the error signal at the output of the other error amplifier. Each diode is otherwise reverse-biased (or insufficiently forward biased to cause conduction), and is therefore nonconductive. Consequently, the error signal appearing on the input 156 to comparator 138 corresponds with whichever of the error signals is greater.

Normally, the error voltage at the output of error amplifier 180 is lower than the error voltage at the output of error amplifier 136. Consequently, diode 196 is normally reverse biased and diode 162, forward biased. The duration of the pulses provided by the pulse duration modulator circuitry is thus controlled in accordance with the magnitude of the output voltage provided by the DC-DC converter. If excessive current levels exist within the primary circuit of the DC-DC converter, however, the output of error amplifier 180 will rise above the output of error amplifier 136, thereby exercising overriding control of the duration of the pulses provided by the converter control circuit 160. The second error amplifier 180 thereby protects the DC-DC converter circuit from inadvertent damage due to excessive current draw.

The second pulse width modulator comparator 182 is included to control the minimum width of the pulses appearing at the output of OR gate 168. If the error voltage appearing at the input to comparator 138 is very small, the output pulses provided by comparator 138 will be very narrow. The output pulses provided by comparator 182, however, are normally of fixed duration, and are synchronized with the pulses provided by comparator 138. When the pulses from comparators 138 and 182 are combined in the OR gate 168, therefore, the resulting combined pulse train consists of only those pulses having the greatest duration (see waveforms D, E, and F of FIG. 4). The net result, therefore, is that the pulses provided by comparator 182 establish the minimum pulse duration of the pulses at the output of OR gate 168.

Comparator 182 has its inverting input connected to the oscillator 134 and its noninverting input connected to ground through an offset voltage source 184 and a resistor 186. A capacitor 188 is connected between the output of the regulator 148 and the resistor 186. The capacitor 188 is included to "soft start" the DC-DC converter when it is first turned on. Normally, the capacitor 188 will be charged up to five volts, hence no capacitor charging current will flow to resistor 186 through the capacitor. In this event, the signal at the noninverting input of comparator 182 will be the offset voltage of offset voltage source 184. The offset voltage source thus normally establishes the minimum width of the pulses at the output of OR gate 168. The capacitor 188 is fully discharged when convert control circuit 60 is first turned on, however. A high initial charging current therefore passes from capacitor 188 to resistor 186 when circuit 60 is first turned on, causing a voltage drop to appear across resistor 186. The initial voltage drop across resistor 186 adds to the offset voltage of source 184, increasing the minimum width of pulses at the output of OR gate 168. As capacitor 188 charges up to its final value, charging current diminishes. The voltage drop across resistor 186 thus diminishes rapidly to zero, causing the minimum width of pulses at the output of OR gate 168 to contract to the limit established by offset voltage source 184.

It will be recalled that the pulse steering circuit 164 inverts the pulses such that narrow pulses are applied to the MOSFETs 116 and 118 when wide pulses exist at the output of OR gate 168, and vice versa. Consequently, upon turn on, the soft start capacitor 188 causes narrow pulses to be intially applied to DC-DC converter 58. As capacitor 188 charges, the pulses in width to gradually build up the 60 VDC output of the power converter.

Figure 5:
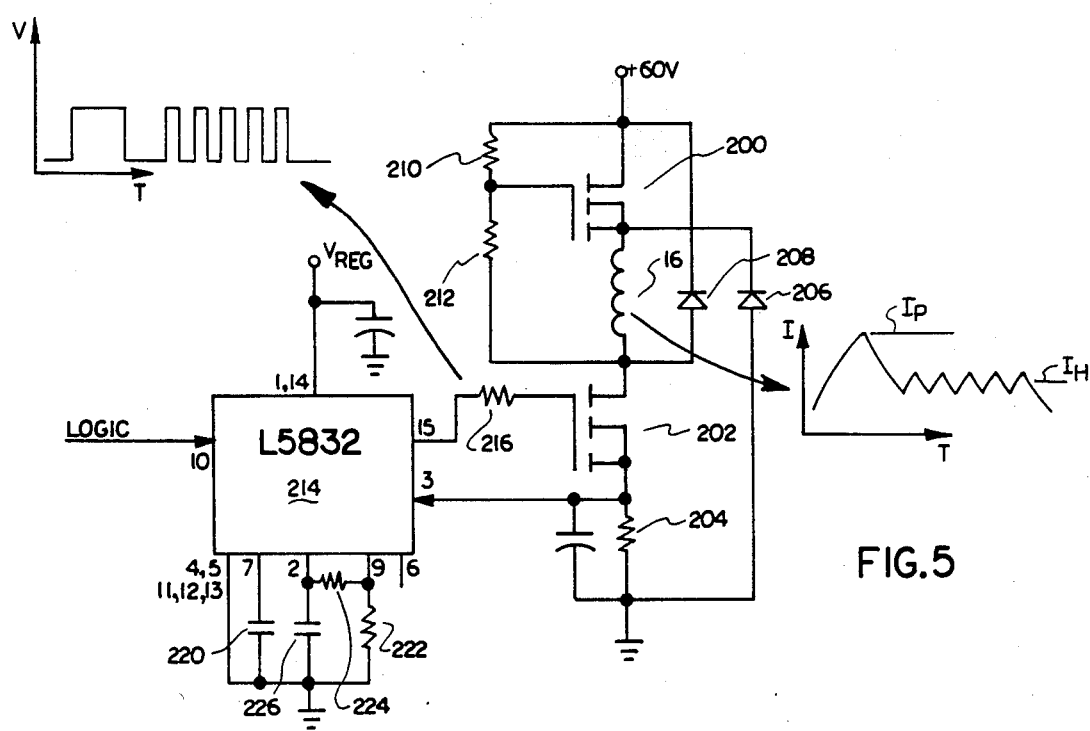
FIG. 5 is a circuit schematic of a fuel injector driver and an associated fuel injector waveform control circuit of the FIG. 1 apparatus.

FIG. 5 provides a more detailed illustration of the circuit components associated with the power switch 24 and waveform control circuit 26 of FIG. 1. In FIG. 5, the injector coil 16 is shown connected across the +60 volt supply line in series with two MOSFETs 200 and 202 and a current sensing resistor 204. The MOSFET 200 has its drain connected to the +60 volt source and its source connected to one end of the coil 16, whereas the MOSFET 202 has its drain connected to the opposite end of coil 16 and its source connected to the current sensing resistor 204. The other end of the current sensing resistor 204 is connected to signal ground. The source of MOSFET 200 is also connected to earth ground through a diode 206, whereas the drain of MOSFET 202 is connected to the +60 volt supply line through a diode 208. The free-wheeling diodes 206 and 208 are poled such that they are reverse-biased by the supply voltage.

The gate of MOSFET 200 is connected to the junction between two biasing resistors 210 and 212. The biasing resistors, in turn, are connected in series between the +60 volt supply line and the drain of MOSFET 202. This biasing arrangement is operative to force the state of MOSFET 200 (i.e., "on" or "off") to follow the state of transistor 202.

MOSFET 202 is controlled by a waveform control circuit 26, which may take any conventional form. In the FIG. 5 embodiment, however, a single integrated circuit 214 is used to provide the waveform control function. The integrated circuit 214 used in the FIG. 5 embodiment is an L5832 solenoid controller, manufactured and sold by SGS Semiconductor Corp of Phoenix, Ariz. The gate of transistor 202 is connected to the output of the integrated circuit 214 through a resistor 216. The source of the MOSFET 202 is connected to a "current sense" input pin of the integrated circuit 214.

The L5832 integrated circuit, when connected as shown in FIG. 5, applies a modulated pulse signal to the gate electrode of MOSFET 202, and monitors the current flow through the solenoid coil 16 by monitoring the voltage drop across the current sensing resistor 204. Each time that a high logic level signal is applied to the gate of MOSFET 202, both it and MOSFET 200 turn on, effectively connecting the coil 16 across the 60 volt supply line. Current then begins to build up through the solenoid. As the current increases, the voltage drop across the current sensing resistor 204 similarly increases. When the voltage drop across the current sensing resistor 204 reaches a preset limit, the output of the L5832 drops to a low logic level, thereby turning off both MOSFET 202 and MOSFET 200. The current flowing through inductor 16 continues flowing due to the inductance of the coil, causing the voltage at the drain of MOSFET 202 to increase and the voltage at the source of MOSFET 200 to decrease. The induced voltages cause diodes 206 and 208 to become forward biased, whereby the inductive energy within the coil 16 is wheeled back into the 60 volt power supply line.

The L5832 integrated circuit 214 controls current through the solenoid coil 16 in response to a logic signal supplied to it by the fuel injection timing control circuit 40. Essentially, the circuit 214 turns on the solenoid when the logic signal has a high logic level, and turns off the solenoid when the logic signal has a low logic level. The circuit modulates the current through the solenoid when it is "on", moreover, providing a high initial current surge through the coil to achieve rapid pull-in of the solenoid, followed by a much lower holding current. As mentioned above, solenoid coil current is regulated by controlling the on/off states of MOSFETs 200 and 202.

The regulation characteristics of the circuit 214 are "programmed" by the values of components connected to pins 2, 6, 7 and 9 of the integrated circuit. In the embodiment of FIG. 5, a capacitor 220 is connected between pin 7 and ground, a resistor 222 is connected between pin 9 and ground, and pin 6 is left open. With these connections, the L5832 will respond to a high logic level input signal by turning on the MOSFETs 200, 202 and leaving them on until the current through the coil 16 reaches a certain peak current ($I_P$). Once the coil current reaches the selected peak, the MOSFETs 200, 202 are turned off. The coil current will then decay towards zero. When the coil current decays to the holding current ($I_H$), however, the circuit 214 will turn the MOSFETs back on again, thereafter rapidly switching them "on" and "off" so that the current through the coil 16 remains approximately at the selected holding current. The magnitude of the holding current is dependent upon the level of current flowing into pin 2 of the integrated circuit. In the FIG. 5 embodiment, current into pin 2 comes from pin 9 through resistor 224, and is set by the value of resistor 224. Preferably, a filter capacitor 226 is connected between pin 2 and ground.

Thus, to summarize, the fuel injection apparatus in accordance with the present invention is designed to operate from a chemical storage battery, however the circuitry is itself powered from a separate power supply connected to the battery. More specifically, the circuitry includes an electric power converter which is powered from the vehicle battery. The power converter includes feedback elements which regulate the magnitude of the output voltage such that it remains at a high DC level regardless of normal variations in the battery voltage. In addition, a second circuit provides a regulated, lower amplitude signal by bootstrapping the battery voltage with the synthesized high voltage DC signal. The resulting regulated low voltage DC signal is applied to the control electronics of the electric power converter, itself, as well as to the control electronics of the electric fuel injected drivers.

Since the solenoid coils are powered from a relatively high voltage power signal, they can be and are designed to have a significantly higher number of coil turns than conventional 12 volt coils. The coils still use the same amount of power as in the past but they obtain the power by drawing low current from a high voltage source instead of by drawing high current from a low voltage source. The associated solid state switches, however, now dissipate substantially less power since both current through the switches and voltage across the switches (when "on") are lower than in previous designs. The solenoids, moreover, actuate at a constant rate regardless of battery voltage since the solenoid supply voltage remains constant.

Although the invention has been described with respect to a preferred embodiment, it will be appreciated that various rearrangements and alterations of parts may be made without departing from the spirit and scope of the present invention, as defined in the appended claims. For example, although in the FIG. 1 fuel injection system each injector has its own waveform control circuit, other arrangements are possible. Thus, a single waveform control circuit could instead be provided, together with a multiplexor for applying the output of the waveform control circuit to a selected one of the four power switches. The multiplexor could simply be four solid state switches, each connected between the output of the waveform control circuit and the input to a corresponding one of the four power switches.

The four power switches would then preferably share a common current sensing register so that it would not be necessary to switch the current sensing input of the waveform control circuit from one current sensing resistor to another. The input signal for the waveform control circuit would be derived by "OR'-'ing together the four outputs of the fuel injection timing control circuit and each of the four multiplexor switches would be separately controlled by a corresponding one of the four outputs of the waveform control circuit.

What is claimed is:

1. Apparatus for use in conjunction with an internal combustion engine including electrically operated fuel injectors and a battery for providing electrical power to operate said injectors comprising:
    means for converting the DC voltage signal provided by said battery into a first oscillating voltage signal and responsive to a feedback signal for controlling at least one characteristic of said first oscillating voltage signal;
    transformer means responsive to said first oscillating voltage signal for generating a second oscillating voltage signal of higher amplitude therefrom;
    rectifier means for converting said second oscillating voltage signal into a second DC voltage signal;
    means for providing said feedback signal in accordance with said second DC voltage signal and for applying said feedback signal to said converting means, said feedback signal causing said converting means to adjust said characteristic of said first oscillating voltage signal such that said second DC signal remains substantially constant at a value substantially greater than said DC voltage signal from said battery; and,
    means for applying said second DC signal to said electrically operated fuel injectors, said means for applying said second DC signal including actuatable switch means connected to said fuel injectors and having an input directly connected to said substantially constant, second DC voltage signal for, when said switch means is actuated, connecting said substantially constant, second DC voltage signal to said electrically operated fuel injectors to thereby cause fuel to be injected into said engine and means for actuating said switch means.

2. Apparatus as set forth in claim 1, wherein said feedback signal providing means comprises means for providing an error signal representative of the time averaged difference between the actual and desired levels of said second DC voltage signal.

3. Apparatus as set forth in claim 1, and further comprising means for providing a separate power signal to said converting means, said means usually providing power to said converting means from said battery, but providing power to said converting means from said second DC signal whenever said first DC signal drops below a selected level.

4. Apparatus for use in conjunction with an internal combustion engine including at least one electrically operated fuel injector and a battery for providing electrical power to operate said injector, comprising:
    power supply means responsive to a first DC signal provided by said battery for providing a second DC voltage for application to said at least one injector,
    switch means for selectively coupling said at least one injector to, or uncoupling said at least one injector from, said second DC voltage, and
    means for controlling the operation of said switch means so as to thereby control fuel injection into said internal combustion engine,
    wherein said power supply means includes first means and second means, said first means including a DC-DC converter coupled to said battery for generating said second DC signal therefrom, said second DC signal being greater than said first DC signal, and converter control means for controlling operation of said DC-DC converter, and said second means including means for providing power to said converter control means, said providing means deriving said power initially from said first DC signal, and thereafter from said second DC signal whenever said first DC signal drops below a sslected level.

5. Fuel injection apparatus powered by power supply means providing a varying level DC power signal comprising:

electromagnetic fuel injector means for injecting fuel into an internal combustion engine responsive to the application of electrical power thereto;

fuel injection timing control means providing an electrical timing signal for controlling the timing of the application of electrical power to said electromagnetic fuel injector means;

DC-DC converter means connected to said varying level DC power signal voltage for generating a substantially stable DC voltage therefrom regardless of said variations in said DC power signal; and, means for applying said stable DC voltage to said electromagnetic fuel injector means, said means for applying said stable DC voltage including actuatable switch means connected to said electromagnetic fuel injector means and having an input connected to said stable DC voltage for, when said switch means is actuated, connecting said stable DC voltage to said electromagnetic fuel injector means and means for actuating said switch means responsive to said timing signal.

6. Apparatus for use in conjunction with an internal combustion engine including electrically operated fuel injectors and a battery for providing electrical power to operate said injectors comprising:

means for converting the DC voltage signal provided by said battery into a first oscillating voltage signal and responsive to a feedback signal for controlling at least one characteristic of said first oscillating voltage signal;

transformer means responsive to said first oscillating voltage signal for generating a second oscillating voltage signal of higher amplitude therefrom;

rectifier means for converting said second oscillating voltage signal into a second DC voltage signal;

means for providing said feedback signal in acoordance with said second DC voltage signal and for applying said feedback signal to said converting means, said feedback signal causing said converting means to adjust said characteristic of said oscillating voltage signal in a direction to counteract changes in said DC voltage signal and thereby stabilize said second DC signal;

means for applying said second DC signal to said electrically operated fuel injectors to thereby cause fuel to be injected into said engine; and, means for providing a separate power signal to said converting means, said means for providing a separate power signal usually providing power to said converting means from said battery, but providing power to said converting means from said second DC signal whenever said first DC signal drops below a selected level.

7. Apparatus as set forth in claim 6, wherein said feedback signal providing means comprises means for providing an error signal representative of the time average difference between the actual and desired levels of said second DC voltage signal.

8. Apparatus as set forth in claim 6, wherein said transformer means is designed such that said second oscillating voltage signal is of substantially higher amplitude than said first oscillating voltage signal, and wherein said feedback signal providing means and converting means cooperate to stabilize said second DC signal at a level substantially higher than the level of said first DC signal.

9. Apparatus as set forth in claim 8, wherein said means for applying said second DC signal to said fuel injectors comprises solid state switch means for controllably coupling each said injector across, or decoupling said injector from, said second DC signal, and means for controlling the operation of said switch means.

* * * * *